(12) United States Patent
Yang

(10) Patent No.: US 12,725,983 B2
(45) Date of Patent: Sep. 1, 2026

(54) CONNECTOR ASSEMBLY WITH HEAT SINK MOUNTED ON A SHIELDING CAGE

(71) Applicant: MOLEX, LLC, Lisle, IL (US)

(72) Inventor: Che-Yuan Yang, New Taipei City (TW)

(73) Assignee: Molex, LLC, Lisle, IL (US)

( * ) Notice: Subject to any disclaimer, the term of this patent is extended or adjusted under 35 U.S.C. 154(b) by 285 days.

(21) Appl. No.: 18/382,072

(22) Filed: Oct. 20, 2023

(65) Prior Publication Data

US 2024/0154367 A1 May 9, 2024

(30) Foreign Application Priority Data

Nov. 4, 2022 (CN) ......................... 202222947431.1

(51) Int. Cl.

*H01R 13/6581* (2011.01)
*H05K 7/20* (2006.01)
*H01R 13/6582* (2011.01)
*H01R 13/6583* (2011.01)
*H01R 13/6585* (2011.01)
*H01R 13/6586* (2011.01)
*H01R 13/6587* (2011.01)

(52) U.S. Cl.

CPC ....... *H01R 13/6581* (2013.01); *H05K 7/2039* (2013.01); *H05K 7/20436* (2013.01); *H05K 7/2049* (2013.01); *F28F 2215/00* (2013.01); *H01R 13/6582* (2013.01); *H01R 13/6583* (2013.01); *H01R 13/6585* (2013.01); *H01R 13/6586* (2013.01); *H01R 13/6587* (2013.01); *H05K 7/20* (2013.01)

(58) Field of Classification Search

CPC ............ H01R 13/6581; H01R 13/6582; H01R 13/6583; H01R 13/6585; H01R 13/6586; H01R 13/6587; H05K 7/2039; H05K 7/20436; H05K 7/2049; H05K 7/20; F28F 2215/00

See application file for complete search history.

(56) References Cited

U.S. PATENT DOCUMENTS 10,651,598 B2 * 5/2020 Chen .................... G02B 6/4261
2016/0079150 A1 * 3/2016 Chawla .................... H05K 7/20 165/185
2023/0066079 A1 * 3/2023 Chow .................. H05K 7/2049
2024/0206129 A1 * 6/2024 Cai .................... H05K 7/20418

FOREIGN PATENT DOCUMENTS

CN 110296628 B 4/2021
CN 114623722 A 6/2022

* cited by examiner

*Primary Examiner* — Justin M Kratt

(57) ABSTRACT

A connector assembly includes a guiding shield cage and a heat sink module. The guiding shield cage has an inserting passageway. The heat sink module includes a heat sink, a force applying spring, a rotating member and a supporting spring. The heat sink has a thermal coupling portion which is positioned to a bottom portion of the heat sink and a force applying spring acting portion. The force applying spring has an elastic arm and a bottom arm, the elastic arm is used to downwardly act to the bottom arm, the bottom arm is used to downwardly act to the force applying spring acting portion. The rotating member has a first rod and a second rod, the first rod is used to extend into the inserting passageway, the second rod is used to act to the elastic arm of the force applying spring.

20 Claims, 11 Drawing Sheets

FIG. 3

CONNECTOR ASSEMBLY WITH HEAT SINK MOUNTED ON A SHIELDING CAGE

CROSS-REFERENCE TO RELATED APPLICATIONS

The present application claims priority to Chinese Patent Application No. 202222947431.1 filed on Nov. 4, 2022, which is incorporated by reference in its entirety.

TECHNICAL FIELD

The present disclosure relates to a connector assembly, and particularly relates to a connector assembly which has a heat sink.

BACKGROUND

Chinese patent document CN110296628A (corresponding to U.S. Pat. No. 10,651,598 B2) discloses a heat exchange structure, the heat exchange structure includes a metal piece, a lever and a framework, the framework is used to support the lever and the metal piece, a front end of the metal piece is fixed on a front edge of the framework by a fastener such as a rivet. When a heat source slides relative to a heat sink, the heat source actuates the lever to rotate, the lever applies a downward acting force to a rear end of the metal piece, the front end of the metal piece downwardly pushes the front edge of the framework so as to make the framework bring the heat sink and a thermal conductive pad provided on the heat sink to contact the heat source. However, in such a prior art, the framework needs to be additionally provided for mounting the lever and the metal piece, so it is more complex in construction. And the metal piece needs to be provided to a top portion of the heat sink, which results in that the top portion of the heat sink needs to be grooved to mount the metal piece, the metal piece occupies a space which allows the metal piece to be elastically deformed in an up-down direction, and the lever occupies an up-down space and a front-rear space which allow the lever to rotate and swing, so a large amount of a space of the heat sink is occupied, and a heat dissipating area of the heat sink is decreased, in turn heat dissipating efficacy is significantly lowered, also it is difficult to make the heat sink and the entire heat dissipating module thinned. In addition, the metal piece and the heat sink are engaged with each other through only single-point (screw), and when the lever is pushed, the lever is pressed on the rear end of the metal piece, such a design would make the heat sink easily skew.

Chinese patent document CN114623722A discloses that, two pressure applying elastic members are respectively provided at two side surfaces of a heat sink, two supporting elastic members also are respectively provided at the two side surface of the heat sink, but, each pressure applying elastic member has two heat sink acting portions which are positioned to a front end and a rear end of the pressure applying elastic member and are used to push the heat sink to move, the front ends and the rear ends of the two pressure applying elastic members are integrally connected therebetween with a front frame and a rear frame so as to together constitute a pressure applying framework. however, such a design utilizes the two pressure applying elastic members, the front frame and the rear frame to together constitute the pressure applying framework is more complex in construction, moreover, elastic forces of the two pressure applying elastic members need to be applied to a front end and a rear end of the heat sink respectively via the front frame and the rear frame at the front end and the rear end of the two pressure applying elastic members, because the pressure applying elastic member is subjected to a force at a center of the pressure applying elastic member, if a length of arm of force from a location where the pressure applying elastic member is subjected to the force to the front frame and a length of arm of force from a location where the pressure applying elastic member is subjected to the force to the rear frame are too long, the acting forces at the front end of the heat sink and the acting force at the rear end of the heat sink will be reduced, it also easily results in that the acting force applied to the front end of the heat sink and the acting force applied to the rear end of the heat sink are not in balance and in turn it easily results in an up-down movement distance of the front end of the heat sink and an up-down movement distance of the rear end of the heat sink are not in balance.

SUMMARY

Therefore, an object of the present disclosure is to provide a connector assembly which can improve at least one deficiency of the prior art.

Accordingly, in some embodiments, a connector assembly of the present disclosure comprises a guiding shield cage and a heat sink module. The guiding shield cage has a top wall and an inserting passageway positioned in an interior of the guiding shield cage, the top wall has a window communicated with the inserting passageway. The heat sink module is provided to the guiding shield cage and the heat sink module comprises a heat sink, a force applying spring, a rotating member and a supporting spring. The heat sink has a thermal coupling portion which is positioned to a bottom portion of the heat sink and a force applying spring acting portion which extends front and rear. The force applying spring has an elastic arm and a bottom arm which extend front and rear, the elastic arm is positioned above the bottom arm and is used to downwardly act to the bottom arm, the bottom arm is used to downwardly act to the force applying spring acting portion of the heat sink. The rotating member has a first rod and a second rod, the first rod is used to extend into the inserting passageway, the second rod is used to act to the elastic arm of the force applying spring. The supporting spring elastically upwardly supports the heat sink. The rotating member is capable of rotating between a first position and a second position, the heat sink is capable of moving between a third position which is positioned to the up and a fourth position which is positioned to the down; when the rotating member is in the first position, the first rod extends into the inserting passageway, and the heat sink is supported by the supporting spring and is in the third position; when the rotating member is the second position, the first rod is relatively away from the inserting passageway, and the second rod of the rotating member acts to the elastic arm of the force applying spring and brings the bottom arm to move downwardly and downwardly directly act to the force applying spring acting portion of the heat sink so as to make the heat sink positioned to the fourth position.

In some embodiments, the heat sink has two force applying spring acting portions which are positioned to two sides of the heat sink, the heat sink module comprises two force applying springs which are positioned to the two sides of the heat sink and are respectively used to act to the two force applying spring acting portions, the rotating member has two second rods which are respectively used to act to the two elastic arms of the two force applying springs.

In some embodiments, the elastic arm and the bottom arm are integrally constructed and connected with each other, the elastic arm of each force applying spring is rearwardly folded back from a front end of the bottom arm, and a rear end of the elastic arm downwardly abuts against and acts to a rear end of the bottom arm.

In some embodiments, the two rear ends of the two bottom arms of the two force applying springs are integrally constructed and connected therebetween via a transverse connection arm.

In some embodiments, the elastic arm has a rotating member acting portion which is positioned to a middle of the elastic arm, a tip of the second rod of the rotating member acts to the rotating member acting portion of the elastic arm.

In some embodiments, the rotating member acting portion is constructed as a recessed portion, the second rod has a protruding portion which is positioned to the tip of the second rod and is correspondingly cooperatively positioned in the recessed portion.

In some embodiments, the recessed portion constructed by the rotating member acting portion has a pin hole, the protruding portion at the tip of the second rod has a pin which inserts into the pin hole with clearance fit.

In some embodiments, the guiding shield cage comprises a cage body which has the top wall and the inserting passageway and a heat sink bracket which is provided to the cage body and allows the heat sink module to be provided therein, the heat sink bracket has two side plates, the rotating member is pivoted on the two side plates of the heat sink bracket, the heat sink module comprises two supporting springs which are integrally constructed on the heat sink bracket and are respectively positioned below the two sides of the heat sink, the two supporting springs elastically upwardly support the two force applying spring acting portions of the heat sink respectively.

In some embodiments, each force applying spring acting portion is constructed as a side protruding plate which laterally protrudes from a location below the side surface of the heat sink and extends front and rear.

In some embodiments, the heat sink bracket has a lower plate which is formed with a frame mouth, the two supporting springs are constructed on the lower plate and are respectively positioned to two sides of the frame mouth, at least two side edges of a circumference of the frame mouth of the lower plate each are provided with a support protruding bar which protrudes upwardly, top portions of the support protruding bars are higher than connected locations between the two supporting springs and the heat sink bracket.

In some embodiments, the thermal coupling portion of the heat sink comprises a thermal conductive pad.

In some embodiments, the connector assembly is adapted to mate with a pluggable module, when the pluggable module inserts into the inserting passageway of the guiding shield cage from the front to the rear, the pluggable module supplies an external force to push the first rod of the rotating member, in turn pushes the rotating member to gradually rotate to the second position from the first position, the second rod of the rotating member acts to the elastic arm of the force applying spring, the elastic arm is elastically deformed and downwardly acts to the bottom arm of the force applying spring, the bottom arm directly acts to the force applying spring acting portion of the heat sink, after an acting force downwardly applied to the heat sink by the force applying spring is larger than an upward supporting force of the supporting spring and the supporting spring is compressed downwardly, the heat sink gradually moves downwardly to the fourth position from the third position and makes the thermal coupling portion of the heat sink pass through the window and contact a surface of the pluggable module with a contact pressure; when the pluggable module is withdrawn from the inserting passageway, the external force subjected by the rotating member is released, the supporting spring restores from a compressed state and upwardly pushes the heat sink, so as to make the heat sink upwardly move to the third position from the fourth position, the heat sink upwardly pushes the bottom arm of the force applying spring to move upwardly and bring the elastic arm to push the second rod of the rotating member, so as to make the rotating member rotate to the first position from the second position.

In the connector assembly of the present disclosure, the two elastic arms and the two bottom arms of the two force applying springs extend front and rear and are provided to the side surfaces of the heat sink, and furthermore the elastic arm and the bottom arm are integrally constructed and connected with each other, the construction of the force applying spring is simplified and the construction of the heat sink also can be simplified, manufacturing cost is saved. Moreover, because the two bottom arms of the two force applying springs directly apply pressures to act to the two sides of the heat sink respectively, a designed length of the elastic arm and a designed length of the bottom arm in the force applying spring all can be shorten, and because ranges where the two force applying springs apply forces to a left side and a right side of the heat sink respectively do not exceed length ranges of the two bottom arms in the front-rear direction respectively, so the two force applying springs can generate acting forces, which are larger, more stable and more uniform, to the heat sink, so that the heat sink is more stable when the heat sink moves up and down.

BRIEF DESCRIPTION OF THE DRAWINGS

Other Features and Effects of the Present Disclosure Will be Apparent from an Embodiment with Reference to the Drawings, in which:

FIG. 3 is another perspective exploded view of the embodiment viewed from another angle with the receptacle connector of the embodiment omitted;

DETAILED DESCRIPTION

Figure 1:
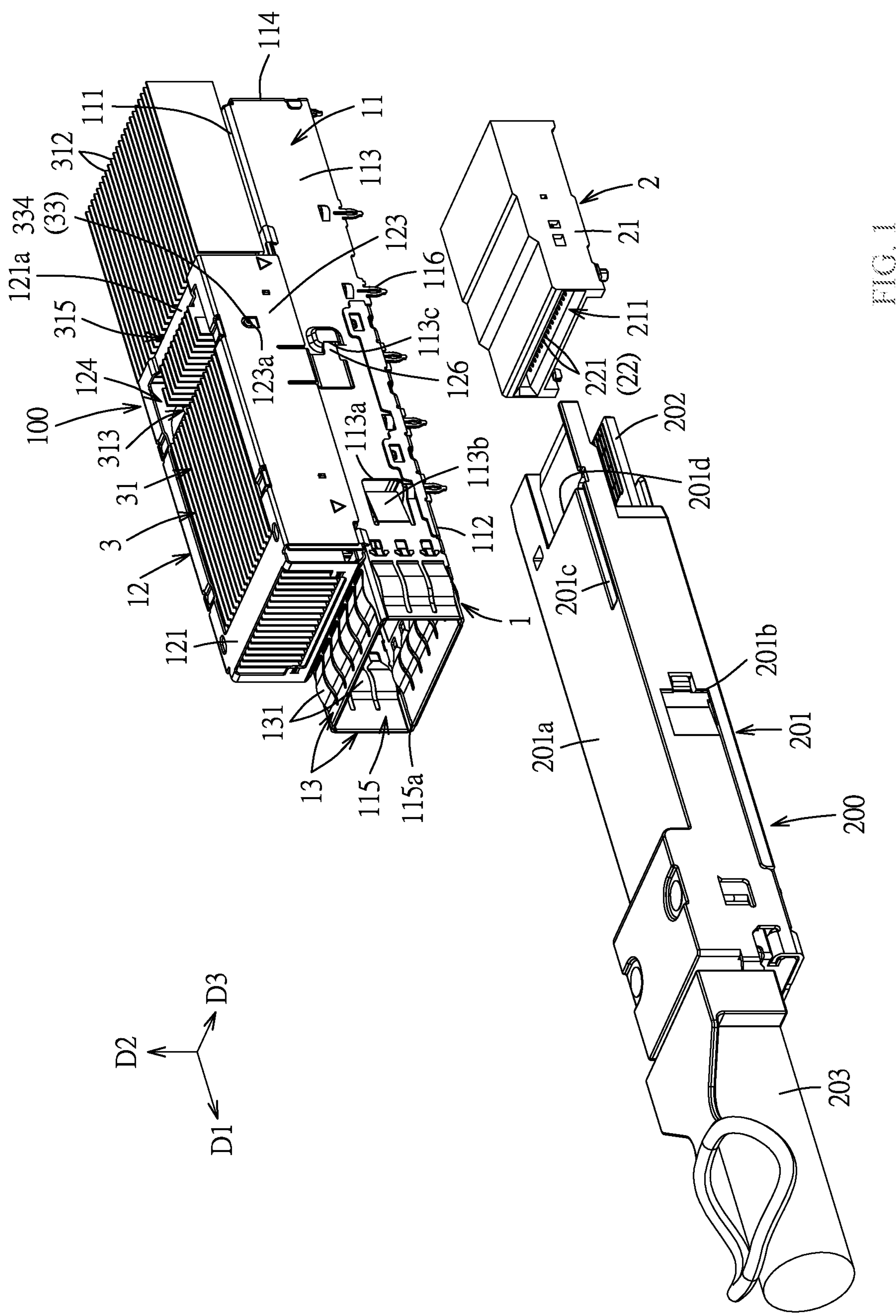
FIG. 1 is a perspective view of an embodiment of a connector assembly of the present disclosure and a pluggable module.
Figure 2:
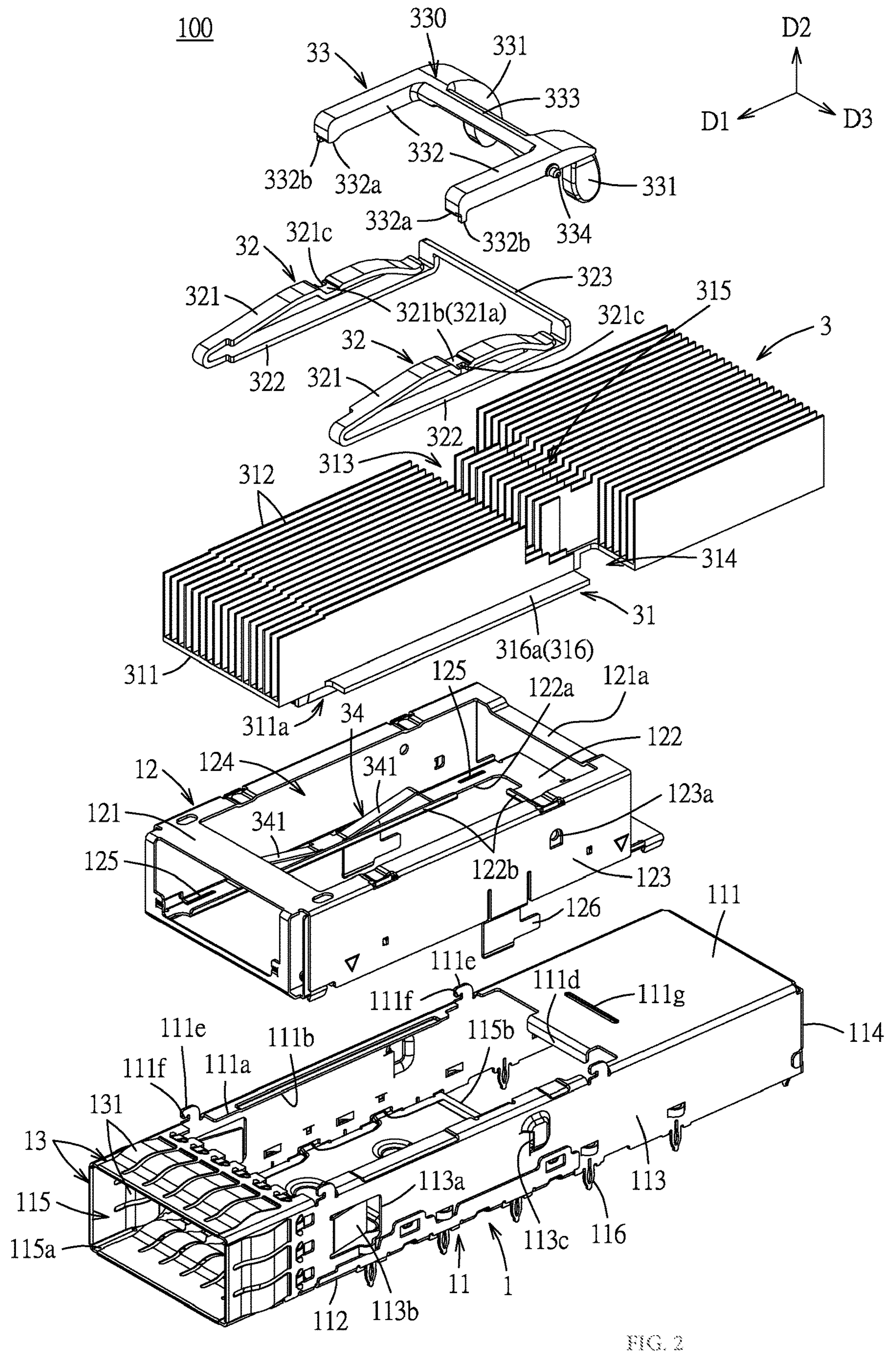
FIG. 2 is a perspective exploded view of the embodiment with a receptacle connector of the embodiment omitted.
Figure 3:
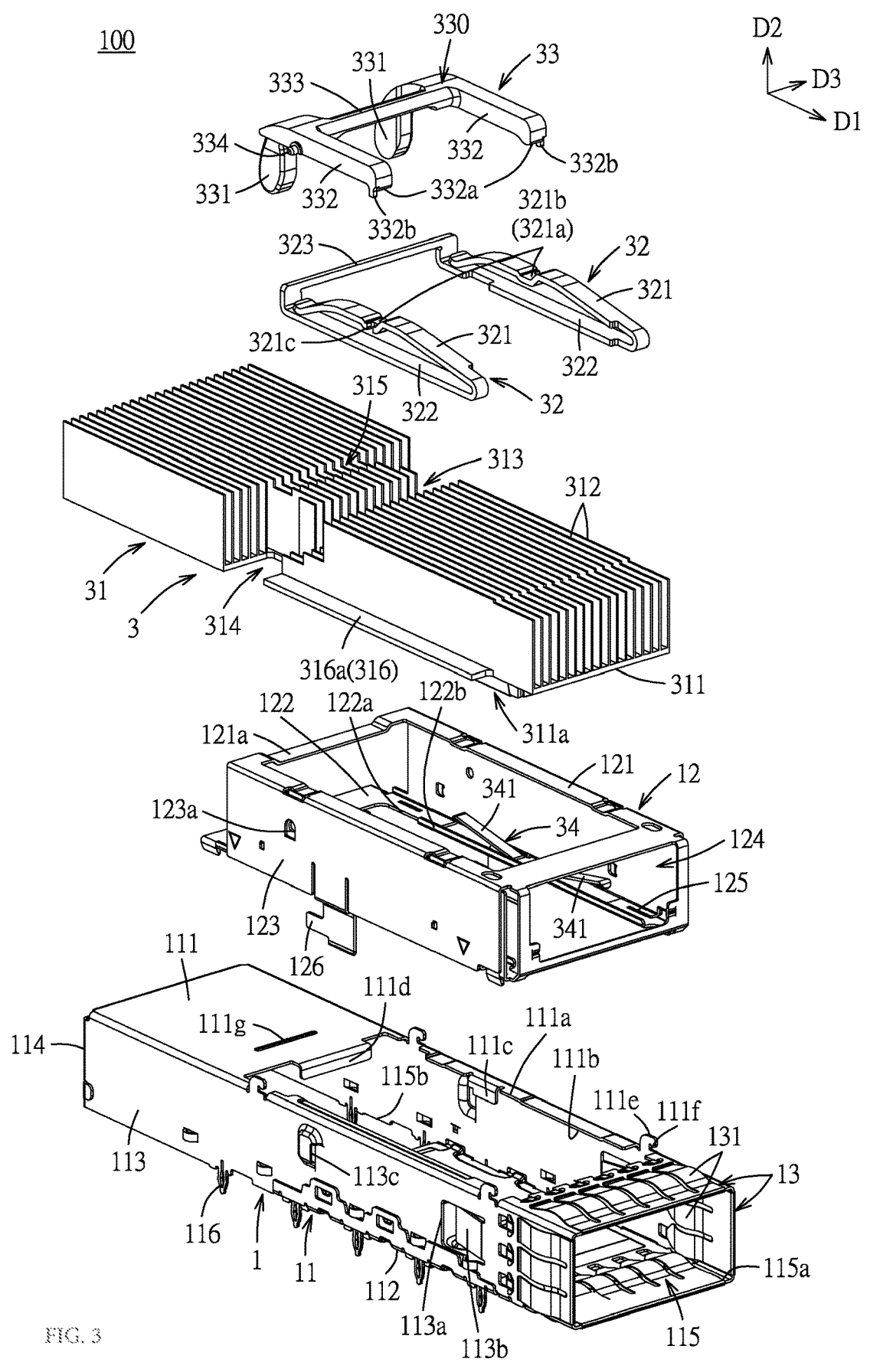
Figure 4:
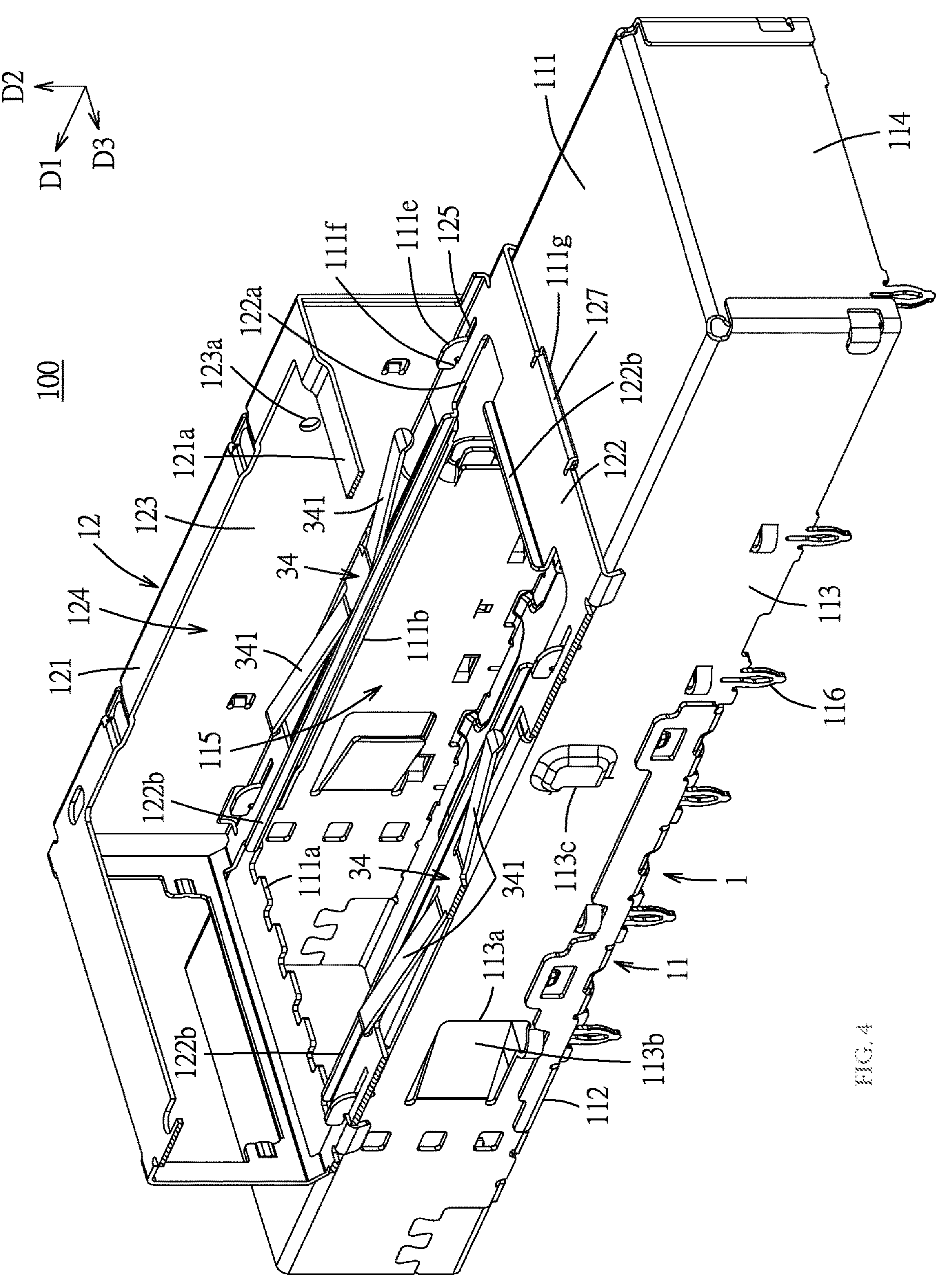
FIG. 4 is a partially cut-away perspective exploded view of a guiding shield cage of the embodiment.
Figure 5:
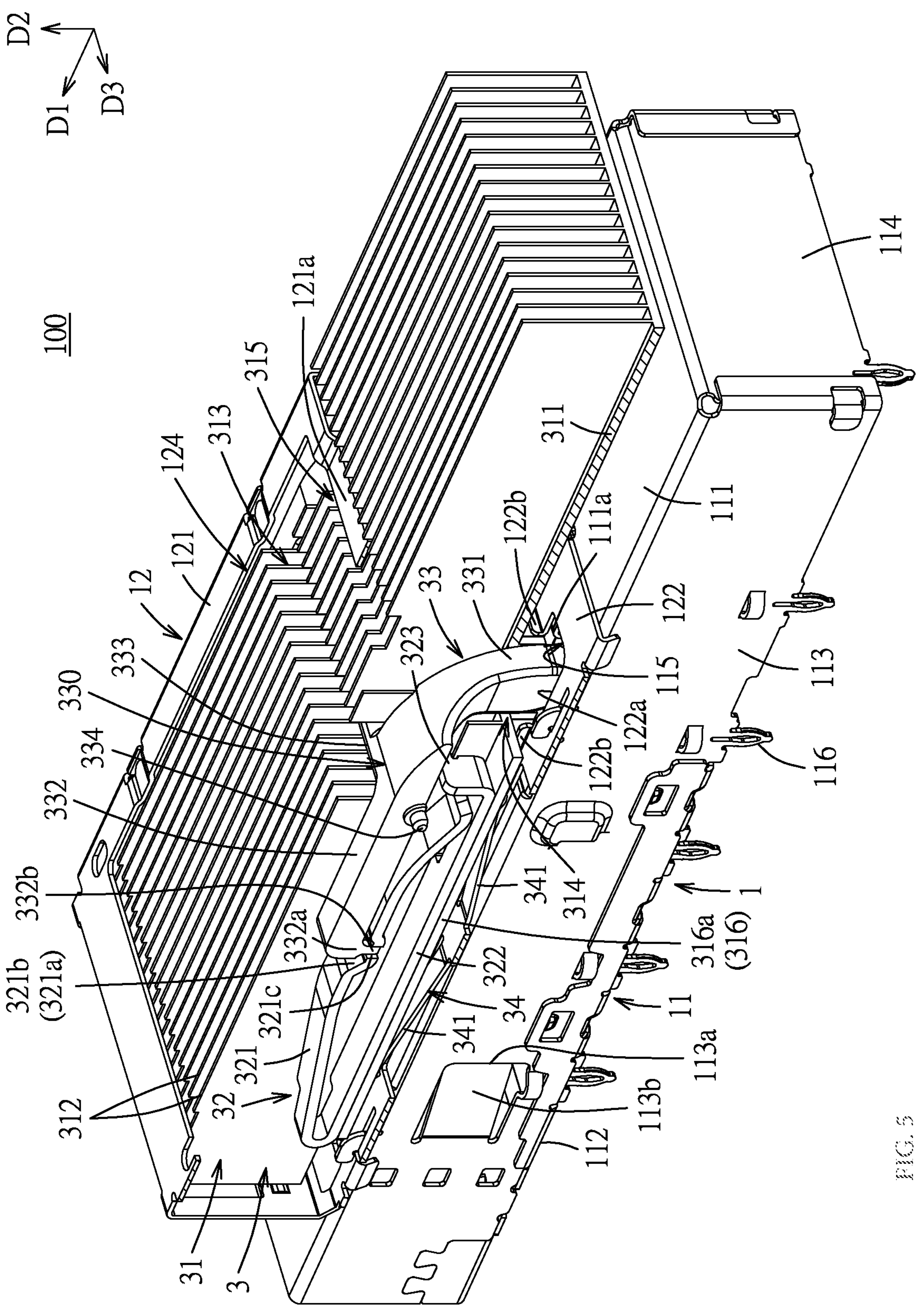
FIG. 5 is a partially cut-away perspective exploded view of the embodiment.

Referring to FIG. 1 to FIG. 4, an embodiment of a connector assembly 100 of the present disclosure is adapted to mate with a pluggable module 200. The pluggable module 200 has a shell member 201, a mating circuit board 202 and a cable 203. The shell member 201 has an inserting portion 201*a*, the mating circuit board 202 protrudes from and is provided to the inserting portion 201*a*, the cable 203 is provided to the shell member 201 and is electrically connected to the mating circuit board 202. The connector assembly 100 includes a guiding shield cage 1, a receptacle connector 2 and a heat sink module 3.

The guiding shield cage 1 for example is formed by processing, such as stamping and bending, a metal thin plate with a mold, the guiding shield cage 1 is used to be provided to a circuit board (not shown) and extends along a front-rear direction D1 (a direction to which an arrow points is front, and an opposite direction is rear). The guiding shield cage 1 includes a cage body 11, a heat sink bracket 12 which is assembled to the cage body 11 and a plurality of grounding members 13 which are assembled to the cage body 11. The cage body 11 has a top wall 111, a bottom wall 112 which is spaced apart from the top wall 111 along an up-down direction D2 (a direction to which an arrow points is up, and an opposite direction is down), two side walls 113 which are spaced apart from each other along a left-right direction D3 (a direction to which an arrow points is right, and an opposite direction is left) and are connected between the top wall 111 and the bottom wall 112, a rear wall 114 which is connected to a rear edge of the top wall 111 and rear edges of the two side walls 113, an inserting passageway 115 which is defined together by the top wall 111, the bottom wall 112, the two side walls 113 and the rear wall 114, and a plurality of inserting leg 116 which extend downwardly from the two side walls 113 and the rear wall 114 and are adapted to be fixed on the circuit board and/or connected to ground traces (not shown). The inserting passageway 115 has an inserting port 115*a* which is toward the front and a bottom opening 115*b* which is positioned behind a bottom portion of the inserting passageway 115, is defined together by the bottom wall 112, the two side walls 113 and the rear wall 114 of the cage body 11 and is toward the down.

The top wall 111 of the cage body 11 has a window 111*a* which is communicated with the inserting passageway 115, two side protruding bars 111*b* which downwardly slightly extend into the inserting passageway 115 from side edges of a left side and a right side of the window 111*a* respectively, a guiding portion 111*c* which extends downwardly from a rear segment of one of the left side and the right side of the window 111*a* into the inserting passageway 115, a stopping portion 111*d* which extends downwardly from a rear end of the window 111*a* into the inserting passageway 115, four retaining pieces 111*e* which extend upwardly and each are formed with a retaining groove 111*f* opened forwardly, and a snapping groove 111*g* which is positioned behind the window 111*a* of the cage body 11. Each side wall 113 of the cage body 11 has an opening 113*a* which corresponds to the inserting passageway 115, an inward extending piece 113*b* which obliquely extends rearwardly from a front edge of the opening 113*a* toward an interior of the cage body 11, and an inserting groove 113*c* which is opened forwardly.

The heat sink bracket 12 is assembled on the top wall 111 of the cage body 11 and allows the heat sink module 3 to be provided therein. The heat sink bracket 12 has an upper plate 121, a lower plate 122, two side plates 123, an internal receiving space 124 which is defined together by the upper plate 121, the lower plate 122 and the two side plates 123, four slots 125 which are formed to two sides of the lower plate 122, extend along the front-rear direction D1 and allow the four retaining pieces 111*e* to pass therethrough respectively, two inserting pieces 126 which extend downwardly and rearwardly from the two side walls 123 and correspondingly rearwardly insert into the two inserting grooves 113*c* respectively, and a snapping piece 127 which extends rearwardly and downwardly from a rear end of the lower plate 122 and correspondingly snaps into the snapping groove 111*g*. Parts of the lower plate 122 which are respectively positioned in front of the four slots 125 snap into the four retaining grooves 111*f* of the four retaining pieces 111*e* respectively. With the above construction, the heat sink bracket 12 is firmly assembled to the top wall 111 of the cage body 11. The lower plate 122 of the heat sink bracket 12 has a frame mouth 122*a* which is formed corresponding to the window 111*a* of the top wall 111 and a plurality of support protruding bars 122*b* which protrude upwardly and are respectively provided to a left side edge, a right side edge and a rear side edge of a circumference of the frame mouth 122*a*, the plurality of support protruding bars 122*b* have a function to strengthen a strength of the lower plate 122. It is noted that, in other embodiment, the plurality of support protruding bars 122*b* also may be provided to at least any two side edges of the circumference of the frame mouth 122*a*.

In the present embodiment, the guiding shield cage 1 of the connector assembly 100 may be provided to a mounting hole (not shown) of a casing (not shown), each grounding member 13 has a plurality of elastic fingers 131 which extend rearwardly from a position where a front end of the cage body 11 is presented and are distributed to an outer side of the cage body 11 and an inner side of the cage body 11, the elastic fingers 131 of the plurality of elastic fingers 131 which is positioned at the outer side of the cage body 11 is used to contact an edge of the mounting hole of the casing, the elastic fingers 131 of the plurality of elastic fingers 131 which is positioned at the inner side of the cage body 11 is used to contact the pluggable module 200.

The receptacle connector 2 is used to be provided on the circuit board, and is received in a rear segment of the inserting passageway 115 of the guiding shield cage 1 via the bottom opening 115*b*. The receptacle connector 2 has a housing 21 which is insulative and a plurality of terminals 22 which are provided to the housing 21. The housing 21 has a mating slot 211 which is toward the front and is used to allow the mating circuit board 202 of the pluggable module 200 to insert therein. Each terminal 22 has a contact portion 221 which is positioned in the mating slot 113*c* and a tail portion (not shown) which extend downwardly out of a bottom portion of the housing 21, the tail portions of the plurality of terminals 22 are used to be provided to the circuit board respectively.

The inserting portion 201*a* of the pluggable module 200 has two locking recessed grooves 201*b* which are positioned to a left side and a right side of the inserting portion 201*a* respectively and are used to respectively cooperate with the two inward extending pieces 113*b* of the two side walls 113 of the cage body 11, a guiding groove structure 201*c* which is positioned to a top portion of a front end of the inserting portion 201*a* and is used to correspondingly cooperate with the guiding portion 1/1*c* of the top wall 111 of the cage body 11, and an alignment structure 201*d* which is positioned to a top portion of the inserting portion 201*a* and is used to correspondingly cooperate with the stopping portion 111*d* of the top wall 111 of the cage body 11. The two inward extending pieces 113*b* of the two side walls 113 of the cage body 11 are used to respectively cooperate with the two locking recessed grooves 201*b* of the pluggable module 200 which inserts into the inserting passageway 115, so as to generate a locking effect. The guiding portion 111*c* is used to insert into the guiding groove structure 201*c* of the pluggable module 200 so as to generate a guiding function. The stopping portion 111*d* is used to be stopped to the alignment structure 201*d* of the pluggable module 200 so as to limit a position where the pluggable module 200 inserts into the inserting passageway 115.

Referring to FIG. 1 to FIG. 3 and FIG. 5, the heat sink module 3 is mounted to the internal receiving space 124 of the heat sink bracket 12 of the guiding shield cage 1 and corresponds to the inserting passageway 115. The heat sink module 3 includes a heat sink 31, two force applying springs 32, a rotating member 33 and two supporting springs 34. The heat sink 31 has a base plate 311, a plurality of heat dissipating fins 312 which extend along the front-rear direction D1, are arranged side by side in the left-right direction D3 and are integrally formed upwardly from a top surface of the base plate 311, a first groove 313 which is formed to the plurality of heat dissipating fins 312 and extend in the left-right direction D3, two second grooves 314 which are respectively formed at a left side and a right side of the plurality of heat dissipating fins 312, extend in the up-down direction D2 and are positioned behind the first groove 313, a third groove 315 which is formed to the plurality of heat dissipating fins 312, extends in the left-right direction D3 and is positioned behind the first groove 313, and two force applying spring acting portions 316 which protrude outwardly from a left side and a right side edge of a front segment of the base plate 311 respectively and extend along the front-rear direction D1. A depth of the third groove 315 is shallow relative to a depth of the first groove 313, and the third groove 315 correspondingly receives a rear frame bar 121*a* of the upper plate 121 of the heat sink bracket 12 which extends in the left-right direction D3, by that the third groove 315 and the rear frame bar 121*a* cooperate with each other, an amount of movement of the heat sink 31 in the front-rear direction D1 can be limited. Each force applying spring acting portion 316 is constructed as a side protruding plate 316*a* which protrudes laterally from one of the two side edges of the base plate 311 (that is, a location below a side surface of the heat sink 31) and extends front and rear.

It is noted that, in a varied embodiment, the plurality of heat dissipating fins 312 also may latch with each other and are provided to the top surface of the base plate 311 by for example welding.

Figure 6:
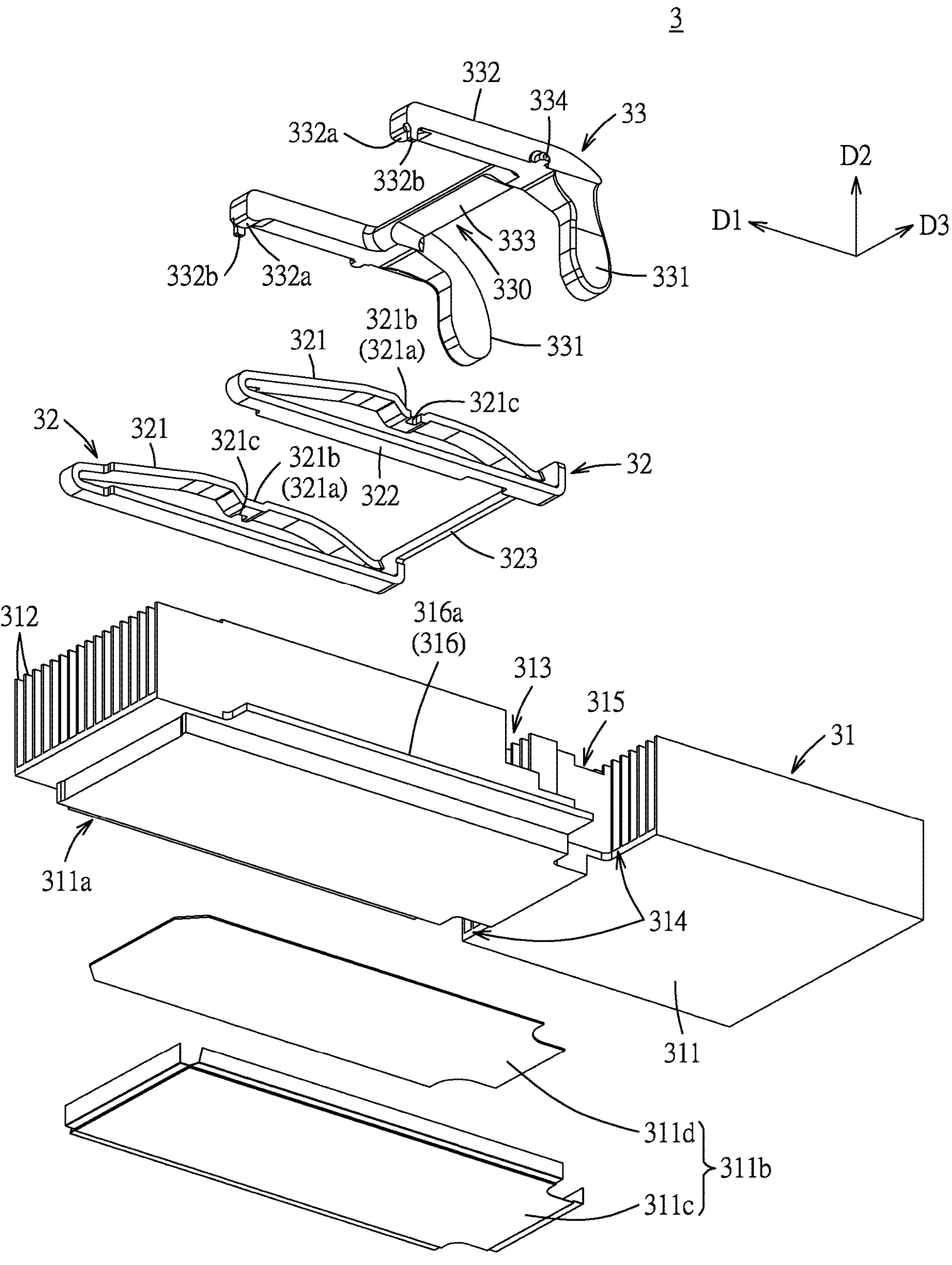
FIG. 6 is a perspective exploded view of a heat sink module of the embodiment.

The base plate 311 has a thermal coupling portion 311*a* which is downwardly formed, the thermal coupling portion 311*a* is used to pass through the frame mouth 122*a* and the window 111*a* to contact the pluggable module 200 which inserts into the inserting passageway 115, so as to enhance heat dissipating performance of the heat sink module 3. The thermal coupling portion 311*a* is limited in position by the frame mouth 122*a*, the window 111*a* and the plurality of support protruding bars 122*b* in the front-rear direction D1 and the left-right direction D3, so the heat sink 31 can be basically limited to move only in the up-down direction D2 so as to make that the heat sink 31 is capable of moving between a third position (see FIG. 9) which is positioned to the up and a fourth position which is positioned to the down (see FIG. 11). Further in combination with referring to FIG. 6, in the present embodiment, the thermal coupling portion 311*a* includes a thermal conductive pad 311*b* which is positioned to a bottom portion of the thermal coupling portion 311*a* and is used to contact the pluggable module 200, the thermal conductive pad 311*b* for example may be a thermal interface material, and the thermal interface material may be selected from a combination of materials which for example have characteristics, such as high thermal conductivity, high flexibility, compressibility, insulation, abrasion resistance and the like, for example may be selected from a combination of a base material 311*c* and a phase change material 311*d*.

Continuously referring to FIG. 1 to FIG. 3 and FIG. 5, the two force applying springs 32 are positioned to two sides of the heat sink 31 and are used to act to the two force applying spring acting portions 316 respectively. Each force applying spring 32 has an elastic arm 321 and a bottom arm 322 which extend along the front-rear direction D1. The elastic arm 321 and the bottom arm 322 of each force applying spring 32 are integrally constructed and are connected with each other, the elastic arm 321 is rearwardly folded back from a front end of the bottom arm 322. The elastic arm 321 is positioned above the bottom arm 322, and a rear end of the elastic arm 321 downwardly abuts against and acts to a rear end of the bottom arm 322 and is used to downwardly act to the bottom arm 322. The two rear ends of the two bottom arms 322 of the two force applying springs 32 are integrally constructed and connected therebetween via a transverse connection arm 323, the transverse connection arm 323 is received in the first groove 313 of the heat sink 31. The elastic arm 321 of each force applying spring 32 has a rotating member acting portion 321*a* which is positioned to a middle of the elastic arm 321, the rotating member acting portion 321*a* for example is constructed as a recessed portion 321*b*, the recessed portion 321*b* constructed by the rotating member acting portion 321*a* has a pin hole 321*c* which is formed at an outer side edge of the recessed portion 321*b*. The two bottom arms 322 of the two force applying springs 32 are used to downwardly act to the two force applying spring acting portions 316 of the heat sink 31 respectively.

The rotating member 33 has a pivoting portion 330, two first rods 331 which are arranged side by side along the left-right direction D3 and extend downwardly from the pivoting portion 330, and two second rods 332 which are arranged side by side along the left-right direction D3 and extend forwardly from the pivoting portion 330. In the present embodiment, the pivoting portion 330 has a transverse rod 333 which extends along the left-right direction D3 and is received in the first groove 313 of the heat sink 31 and two pivoting shafts 334 which extend outwardly from outer sides of the pivoting portion 330 along the left-right direction D3 respectively, each pivoting shaft 334 is pivoted in a pivoting hole 123*a* which is formed in each side plate 123 of the heat sink bracket 12, so the rotating member 33 can rotate between a first position (see FIG. 8) and a second position (see FIG. 10). It is noted that, in a varied embodiment, the rotating member 33 of the heat sink module 3 also may only have one first rod 331 and/or only have one second rod 332, and connected positions between the first rod 331 and the second rod 332 and the pivoting portion 330 also may be changed as desired, for example when there is only one first rod 331, the first rod 331 may be connected to a middle position of the transverse rod 333 of the pivoting portion 330 in the left-right direction D3, so it is not limited to the present embodiment.

The two first rods 331 are used to sequentially pass through the two second grooves 314 of the heat sink 31, the frame mouth 122*a* and the window 111*a* and then extend into the inserting passageway 115. Tips of the two second rods 332 are used to respectively act to the two rotating member acting portions 321*a* of the two elastic arms 321 of the two force applying springs 32, each second rod 332 has a protruding portion 332*a* which is positioned to the tip of the second rod 332 and is correspondingly cooperatively positioned in the recessed portion 321*b* constructed by the rotating member acting portion 321*a*, the protruding portion 332*a* at the tip of the second rod 332 has a pin 332*b* which inserts into the pin hole 321*c* of the recessed portion 321*b* with clearance fit. By cooperation between the recessed portion 321*b* and the protruding portion 332*a* and cooperation between the pin hole 321*c* and the pin 332*b*, the two second rods 332 of the rotating member 33 can more stably act to the two elastic arms 321 of the two force applying springs 32 respectively.

The two supporting springs 34 are respectively positioned at two sides of the frame mouth 122*a* and are integrally constructed on the lower plate 122 of the heat sink bracket 12, and the two supporting springs 34 are respectively positioned below the two sides of the heat sink 31 so as to elastically upwardly support the two force applying spring acting portions 316 of the heat sink 31 respectively. Each supporting spring 34 has two supporting elastic pieces 341 which obliquely extend upwardly respectively toward the front and the rear. It is noted that, in other embodiment, the two supporting springs 34 also may be independent components and are assembled on the heat sink bracket 12 by an assembling manner of welding or latching. Here, top portions of the plurality of support protruding bars 122*b* are higher than connected locations of the two supporting springs 34 with the heat sink bracket 12, when the heat sink 31 is pressed down to a position where the heat sink 31 contacts the plurality of support protruding bars 122*b*, for example in an assembling process, the heat sink 31 may be pressed down by a jig, at this time the plurality of support protruding bars 122*b* can assist in supporting the heat sink 31, at the same time prevent the two supporting springs 34 from being excessively pressed down by the heat sink 31 to generate plastic deformation.

Figure 7:
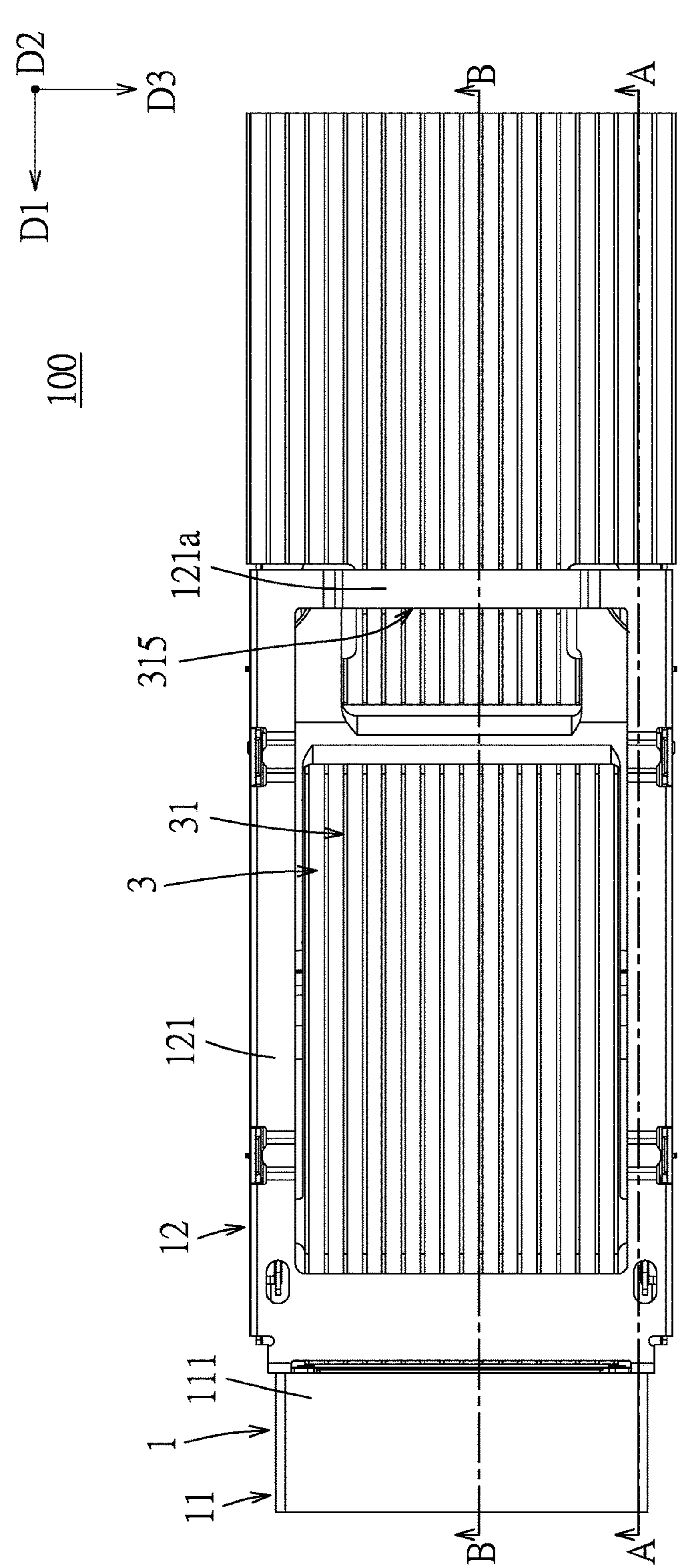
FIG. 7 is a top view of the embodiment.
Figure 8:
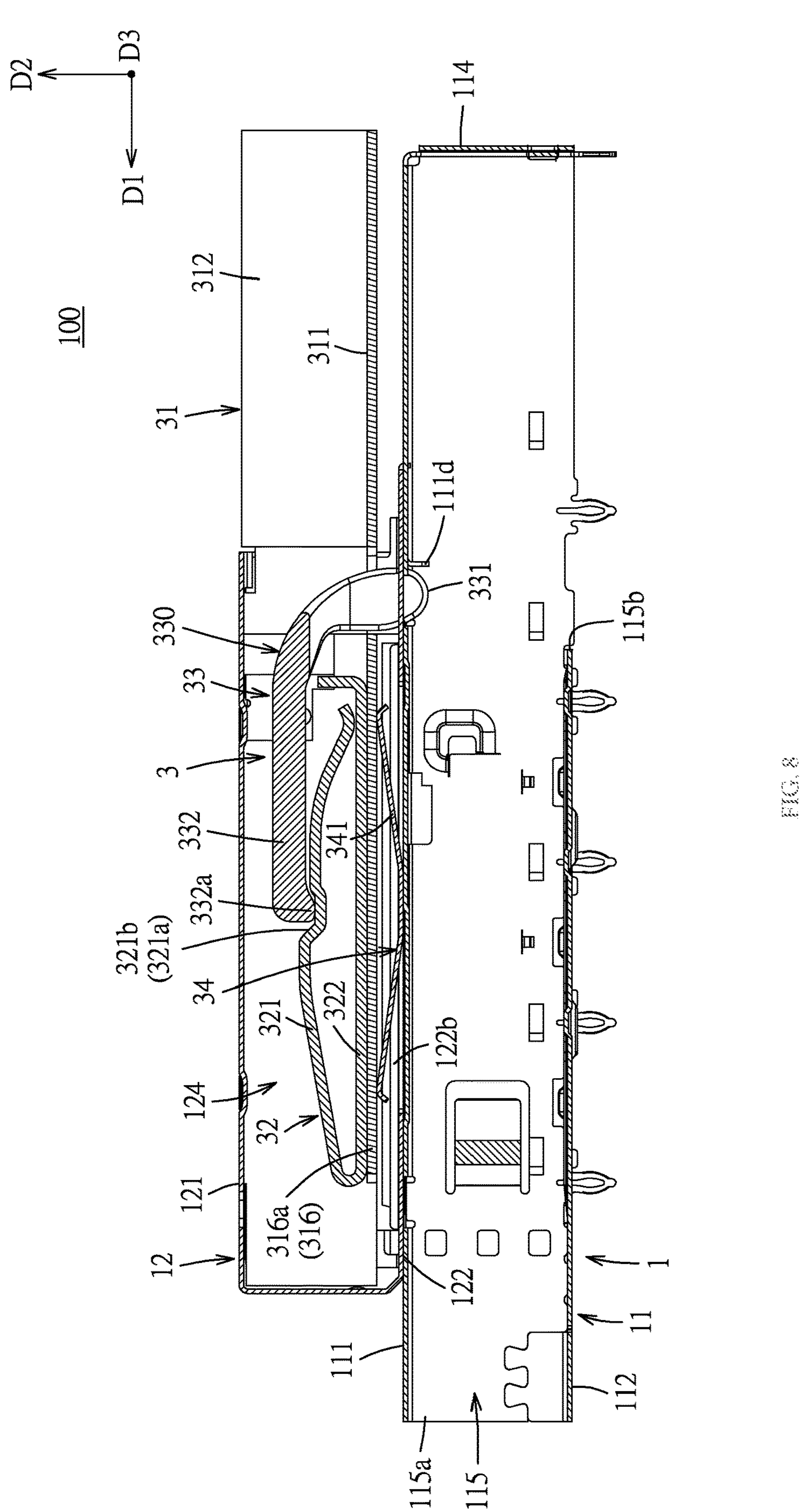
FIG. 8 is a cross sectional view taken along a line A-A of FIG. 7 with the receptacle connector of the embodiment omitted.
Figure 9:
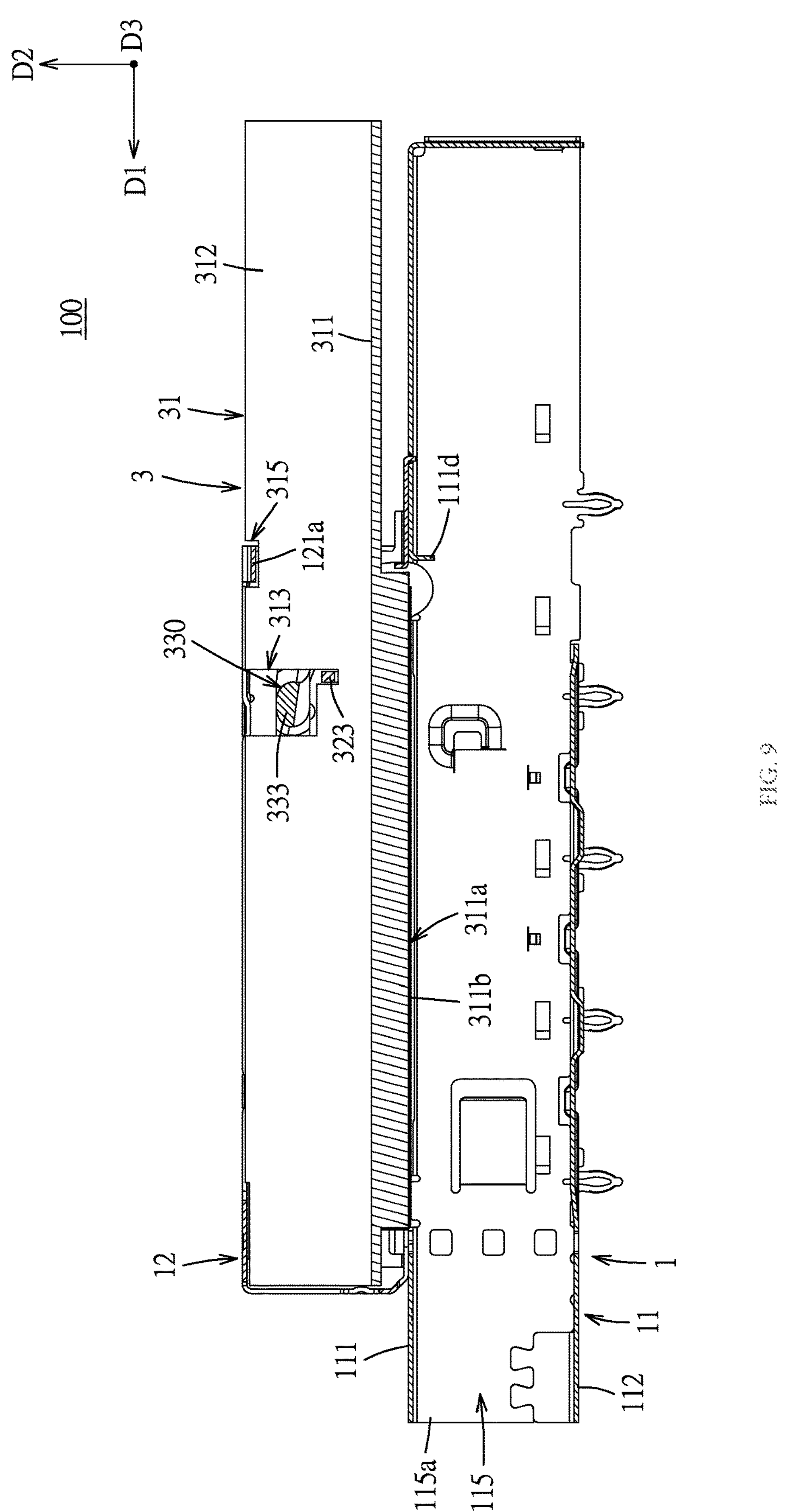
FIG. 9 is a cross sectional view taken along a line B-B of FIG. 7 with the receptacle connector of the embodiment omitted.

Referring to FIG. 7 to FIG. 9, when the pluggable module 200 does not insert into the inserting passageway 115, the rotating member 33 is in the first position, the two first rods 331 of the rotating member 33 extend into the inserting passageway 115, and the heat sink 31 is supported by the two supporting springs 34 and is in the third position, the thermal coupling portion 311*a* of the heat sink 31 does not extend into the inserting passageway 115. It is noted that, in other embodiment, when the heat sink 31 is in the third position, the thermal coupling portion 311*a* of the heat sink 31 may extend into the inserting passageway 115 but be positioned to a height where the thermal coupling portion 311*a* of the heat sink 31 does not contact an upper surface of the pluggable module 200, therefore before the pluggable module 200 pushes the rotating member 33 to move, the thermal coupling portion 311*a* at a bottom portion of the heat sink 31 and the upper surface of the pluggable module 200 has a gap therebetween.

Figure 10:
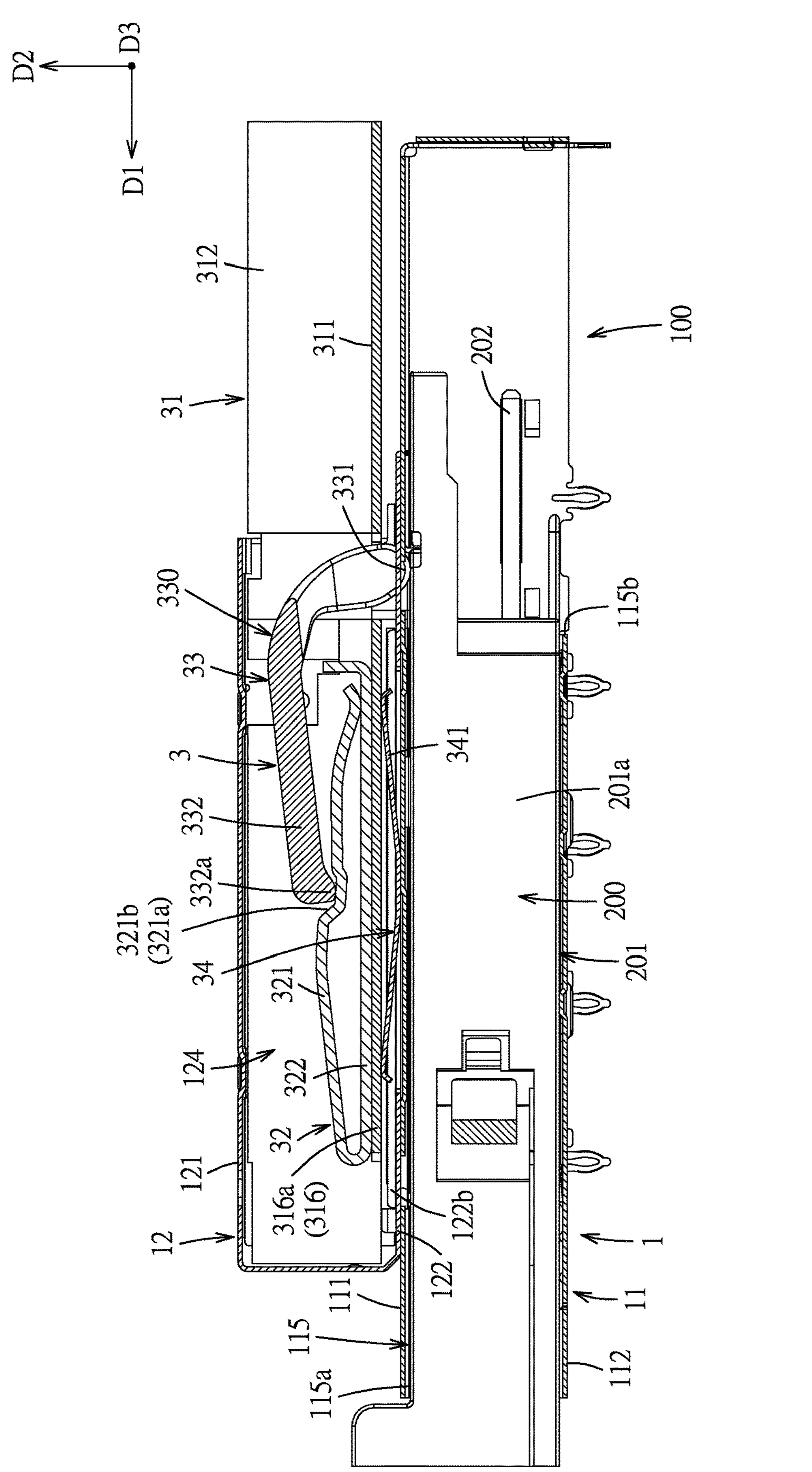
FIG. 10 is a cross sectional view similar to FIG. 8 with the pluggable module inserting into an inserting passageway of the guiding shield cage.
Figure 11:
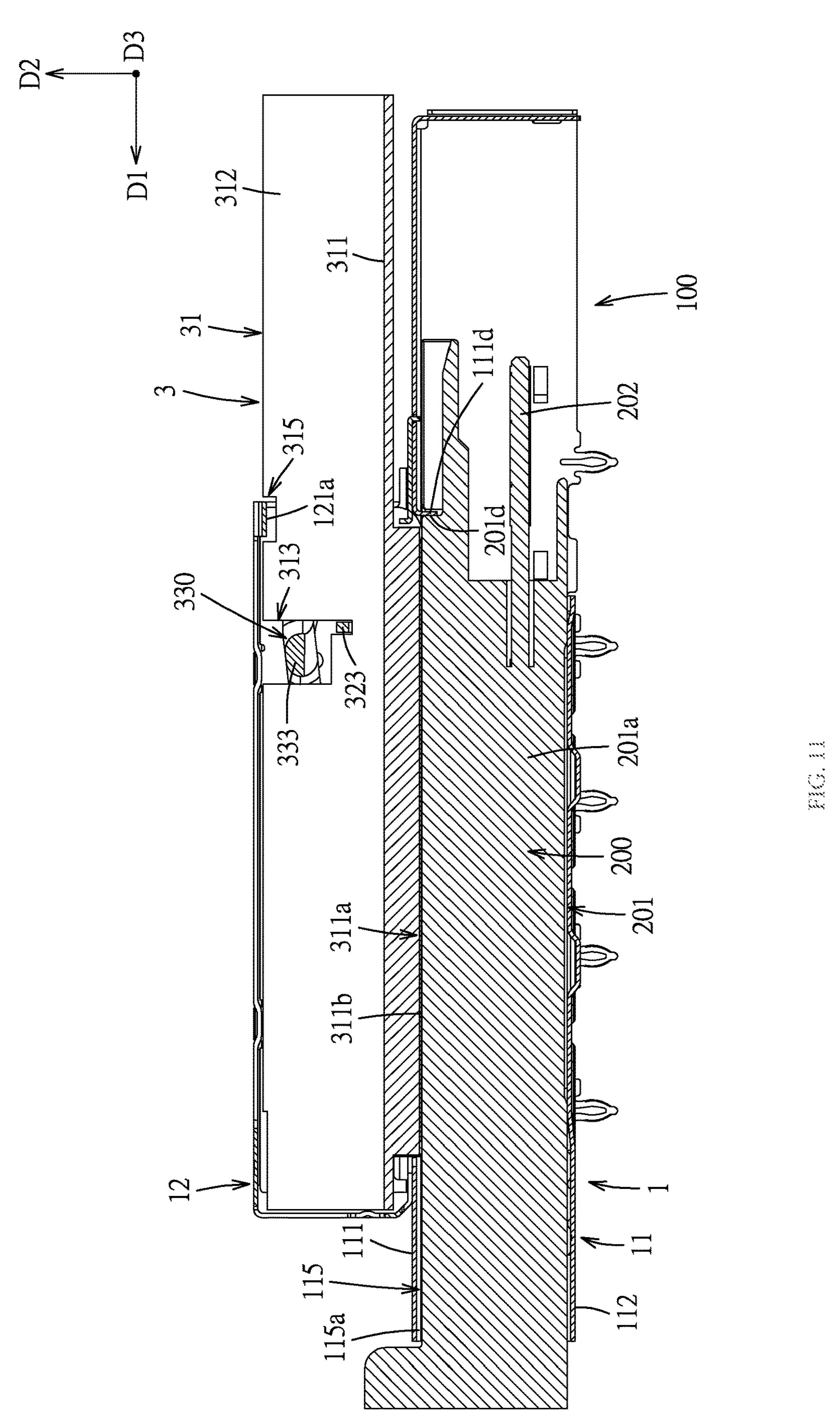
FIG. 11 is a cross sectional view similar to FIG. 9 with the pluggable module inserting into the inserting passageway of the guiding shield cage.

Referring to FIG. 10 to FIG. 11, when the pluggable module 200 inserts into the inserting passageway 115 of the guiding shield cage 1 from the front to the rear via the inserting port 115*a*, the pluggable module 200 supplies an external force to push the two first rods 331 of the rotating member 33, and in turn pushes the rotating member 33 to gradually rotate to the second position from the first position, at this time the two first rods 331 of the rotating member 33 are relatively away from the inserting passageway 115, and the two second rods 332 of the rotating member 33 act to the two elastic arms 321 of the two force applying springs 32 respectively, the two elastic arms 321 of the two force applying springs 32 are pressed down and are deformed downwardly and in turn downwardly act to the two bottom arms 322 of the two force applying springs 32 respectively, so as to bring the two bottom arms 322 of the two force applying springs 32 to move and downwardly directly act to the two force applying spring acting portions 316 of the heat sink 31 respectively, after a force downwardly applied to the heat sink 31 by the two force applying springs 32 is larger than an upward supporting force of the two supporting springs 34 and the two supporting springs 34 are compressed downwardly, the heat sink 31 gradually moves downwardly to the fourth position from the third position, in this state, the thermal coupling portion 311*a* of the heat sink 31 extends into the inserting passageway 115 via the window 111*a* and contacts the upper surface of the pluggable module 200 with a contact pressure.

It is noted that, in the process that the pluggable module 200 inserts into the inserting passageway 115, the two side protruding bars 111*b* of the top wall 111 can limit an insertion inclined angle of the pluggable module 200, prevent a front end of the pluggable module 200 from being excessively inclined upwardly, in turn avoid the thermal conductive pad 311*b* of the thermal coupling portion 311*a* being scratched by an edge of the front end of the pluggable module 200.

Return to refer to FIG. 8 to FIG. 9, when the pluggable module 200 is withdrawn from the inserting passageway 115, the external force subjected by the rotating member 33 is released, the two supporting springs 34 restores from a compressed state and upwardly push the heat sink 31, so as to make the heat sink 31 upwardly move to the third position from the fourth position, at this time, the heat sink 31 upwardly pushes the two bottom arms 322 of the two force applying springs 32 to move upwardly and bring the two elastic arms 321 of the two force applying springs 32 to upwardly push the two second rods 332 of the rotating member 33 respectively, so as to make the rotating member 33 rotate to the first position from the second position, and make the two first rods 331 of the rotating member 33 again extend into the inserting passageway 115.

In conclusion, in the connector assembly 100 of the present disclosure, the two elastic arms 321 and the two bottom arms 322 of the two force applying springs 32 extend front and rear and are provided to the side surfaces of the heat sink 31, and furthermore the elastic arm 321 and the bottom arm 322 are integrally constructed and connected with each other, the construction of the force applying spring 32 is simplified and the construction of the heat sink 31 also can be simplified, manufacturing cost is saved. Moreover, because the two bottom arms 322 of the two force applying springs 32 directly apply pressures to act to the two sides of the heat sink 31 respectively, a designed length of the elastic arm 321 and a designed length of the bottom arm 322 in the force applying spring 32 all can be shorten, and because ranges where the two force applying springs 32 apply forces to a left side and a right side of the heat sink 31 respectively do not exceed length ranges of the two bottom arms 322 in the front-rear direction D1 respectively, so the two force applying springs 32 can generate acting forces, which are larger, more stable and more uniform, to the heat sink 31, so that the heat sink 31 is more stable when the heat sink 31 moves up and down.

However, what is described above is just the embodiment of the present disclosure, which is not intended to limit the scope implementing the present disclosure, any simple equivalent variations and modifications made according to the claims and the specification of the present disclosure will also be fallen within the scope of the present disclosure.

What is claimed is:

1. A connector assembly comprising:

a guiding shield cage having a top wall and an inserting passageway positioned in an interior of the guiding shield cage, the top wall having a window communicated with the inserting passageway; and a heat sink module provided to the guiding shield cage, the heat sink module comprising:

a heat sink having a thermal coupling portion which is positioned to a bottom portion of the heat sink and a force applying spring acting portion which extends front and rear;

a force applying spring having an elastic arm and a bottom arm which extend front and rear, the elastic arm being positioned above the bottom arm and being used to downwardly act on the bottom arm, the bottom arm being used to downwardly act on the force applying spring acting portion of the heat sink;

a rotating member having a first rod and a second rod, the first rod being used to extend into the inserting passageway, and the second rod being used to act on the elastic arm of the force applying spring; and a supporting spring elastically upwardly supporting the heat sink, wherein:

the rotating member is capable of rotating between a first position and a second position, the heat sink is capable of moving between a third position in which the heat sink is positioned in an upward position and a fourth position in which the heat sink is positioned in a downward position, when the rotating member is in the first position, the first rod extends into the inserting passageway, and the heat sink is supported in the third position by the supporting spring, and when the rotating member is the second position, the first rod extends away from the inserting passageway, and the second rod of the rotating member acts on the elastic arm of the force applying spring and brings the bottom arm to move downwardly on the force applying spring acting portion of the heat sink so as to position the heat sink in the fourth position.

2. The connector assembly of claim 1, wherein the heat sink comprises two force applying spring acting portions which are positioned to two sides of the heat sink, the heat sink module comprises two force applying springs which are positioned to the two sides of the heat sink and are respectively used to act on the two force applying spring acting portions, and the rotating member comprises two second rods which are respectively used to act on two elastic arms of the two force applying springs.

3. The connector assembly of claim 2, wherein the elastic arm and the bottom arm of each force applying spring among the two force applying springs are integrally constructed and connected with each other, the elastic arm of each force applying spring among the two force applying springs is rearwardly folded back from a front end of the bottom arm, and a rear end of the elastic arm downwardly abuts against and acts to a rear end of the bottom arm.

4. The connector assembly of claim 3, wherein two rear ends of two bottom arms of the two force applying springs are integrally constructed and connected therebetween via a transverse connection arm.

5. The connector assembly of claim 2, wherein the guiding shield cage comprises a cage body comprising the top wall, the inserting passageway, and a heat sink bracket which is provided to the cage body and allows the heat sink module to be provided therein, the heat sink bracket comprises two side plates, the rotating member is pivoted on the two side plates of the heat sink bracket, the heat sink module comprises two supporting springs which are integrally constructed on the heat sink bracket and are respectively positioned below the two sides of the heat sink, and the two supporting springs elastically upwardly support the two force applying spring acting portions of the heat sink respectively.

6. The connector assembly of claim 5, wherein each force applying spring acting portion is constructed as a side protruding plate which laterally protrudes from a location below a side surface of the heat sink and extends front and rear.

7. The connector assembly of claim 5, wherein the heat sink bracket comprises a lower plate which is formed with a frame mouth, the two supporting springs are constructed on the lower plate and are respectively positioned on two sides of the frame mouth, at least two side edges of a circumference of the frame mouth of the lower plate are each provided with a support protruding bar which protrudes upwardly, and top portions of the support protruding bars are higher than connected locations between the two supporting springs and the heat sink bracket.

8. The connector assembly of claim 1, wherein the elastic arm comprises a rotating member acting portion which is positioned to a middle of the elastic arm, and a tip of the second rod of the rotating member acts on the rotating member acting portion of the elastic arm.

9. The connector assembly of claim 8, wherein the rotating member acting portion is constructed as a recessed portion, and the second rod comprises a protruding portion which is positioned on the tip of the second rod and is correspondingly cooperatively positioned in the recessed portion.

10. The connector assembly of claim 9, wherein the recessed portion comprises a pin hole, and the protruding portion at the tip of the second rod comprises a pin which inserts into the pin hole with a clearance fit.

11. The connector assembly of claim 1, wherein the thermal coupling portion of the heat sink comprises a thermal conductive pad.

12. The connector assembly of claim 1, wherein the connector assembly is adapted to mate with a pluggable module, when the pluggable module is inserted into the inserting passageway of the guiding shield cage from the front to the rear, the pluggable module supplies an external force to push the first rod of the rotating member, which in turn pushes the rotating member to gradually rotate to the second position from the first position, the second rod of the rotating member acts on the elastic arm of the force applying spring, the elastic arm is elastically deformed and downwardly acts on the bottom arm of the force applying spring, the bottom arm directly acts on the force applying spring acting portion of the heat sink, an acting force downwardly applied to the heat sink by the force applying spring is larger than an upward supporting force of the supporting spring and the supporting spring is compressed downwardly, the heat sink moves downwardly to the fourth position from the third position and makes the thermal coupling portion of the heat sink pass through the window and contact a surface of the pluggable module with a contact pressure, and when the pluggable module is withdrawn from the inserting passageway, the external force subjected by the rotating member is released, the supporting spring restores from a compressed state and upwardly pushes the heat sink, so as to make the heat sink upwardly move to the third position from the fourth position, the heat sink upwardly pushes the bottom arm of the force applying spring to move upwardly and bring the elastic arm to push the second rod of the rotating member, so as to make the rotating member rotate to the first position from the second position.

13. A connector assembly comprising:

a guiding shield cage having a top wall and an inserting passageway, the top wall having a window communicated with the inserting passageway; and a heat sink module mounted over the guiding shield cage, the heat sink module comprising:

a heat sink;

a force applying spring having an elastic arm and a bottom arm, the elastic arm being positioned above the bottom arm;

a rotating member having a first rod that extends into the inserting passageway and a second rod used to act on the elastic arm of the force applying spring; and a heat sink bracket comprising a supporting spring, the heat sink being positioned in the heat sink bracket over the supporting spring.

14. The connector assembly of claim 13, wherein the elastic arm is rearwardly folded back from a front end of the bottom arm.

15. The connector assembly of claim 13, wherein the elastic arm and the bottom arm are integrally constructed and the elastic arm is rearwardly folded back from a front end of the bottom arm.

16. The connector assembly of claim 13, wherein the elastic arm comprises a pin hole in a recessed portion, the second rod comprises a pin, and the pin of the second rod is inserted into the pin hole of the elastic arm.

17. The connector assembly of claim 13, wherein the force applying spring is positioned in the heat sink bracket over the heat sink, and the rotating member is pivotably positioned in the heat sink bracket over the heat sink.

18. The connector assembly of claim 13, wherein the force applying spring is positioned over the heat sink, the force applying spring comprises two force applying springs, the two force applying springs comprising two elastic arms and two bottom arms, and the two bottom arms of the force applying spring are positioned over side protruding plates of the heat sink.

19. A connector assembly comprising:

a guiding shield cage having a top wall and an inserting passageway, the top wall having a window communicated with the inserting passageway; and a heat sink module mounted over the guiding shield cage, the heat sink module comprising:

a heat sink having a thermal coupling portion;

a force applying spring over the heat sink, the force applying spring having an elastic arm and a bottom arm, the elastic arm being rearwardly folded back from a front end of the bottom arm;

a rotating member having a first rod that extends into the inserting passageway and a second rod used to act on the elastic arm of the force applying spring to move the thermal coupling portion into the window; and a heat sink bracket, the rotating member being pivotably positioned in the heat sink bracket over the heat sink.

20. The connector assembly of claim 19, wherein the elastic arm comprises a pin hole in a recessed portion, the second rod comprises a pin, and the pin of the second rod is inserted into the pin hole of the elastic arm.

* * * * *